United States Patent [19]

Schwee et al.

[11] 4,100,609

[45] Jul. 11, 1978

[54] MAGNETORESISTANCE DETECTOR FOR CROSSTIE MEMORIES

[75] Inventors: Leonard J. Schwee, Colesville; Henry R. Irons, Beltsville; Wallace F. Anderson, Beltsville; Kurt Peter Scharnhorst, Beltsville; Albert D. Krall, Rockville, all of Md.

[73] Assignee: The United States of America as represented by the Secretary of the Navy, Washington, D.C.

[21] Appl. No.: 720,295

[22] Filed: Sep. 3, 1976

[51] Int. Cl.² .................................................. G11C 19/08
[52] U.S. Cl. ...................................... 365/87; 365/158; 365/223
[58] Field of Search .................. 340/174 TF, 174 SB, 340/174 CA

[56] References Cited
PUBLICATIONS

AIP Conference on Magnetism & Magnetic Materials, Dec. 9-12, 1975, Philadelphia, Pa., pp. 624–625.

*Primary Examiner*—James W. Moffitt
*Attorney, Agent, or Firm*—R. S. Sciascia; A. L. Branning; R. E. Bushnell

[57] ABSTRACT

A detector for non-destructive sensing of binary information at a selected location along a domain wall of a thin magnetic film strip. Voltages are applied across a set of contacts arranged along the margin of the strip and the value of the voltage measured at an arranged, centered contact indicates the presence or absence of a Bloch line-crosstie pair at that location.

32 Claims, 12 Drawing Figures

MAGNETORESISTANCE DETECTOR FOR CROSSTIE MEMORIES

BACKGROUND OF THE INVENTION

This invention relates to the art of shift registers and more particularly, to magnetoresistance circuits and processes for sensing magnetic field patterns on thin film memories.

Prior art thin magnetic film memory devices rely upon detection of the modulation of a high frequency electromagnetic wave by ferromagnetic resonance absorption, e.g., U.S. Pat. No. 3,629,520, or detection of domain wall creep in response to application of a local magnetic field, e.g. U.S. Pat. No. 3,868,660. The bit density and the suitability for multi-unit fabrication of thin magnetic film strip memories available through the teachings of recent disclosures in the thin-film memory art and such novel features as the stable domain wall core disclosed in copending U.S. Patent application Ser. No. 720,296, *Serriform Strip Crosstie Memory*, L. J. Schwee, H. R. Irons, and W. E. Anderson, Navy Case No. 59,905, are incompatible to multilayered detection devices dependent upon ferromagnetic resonance phenomena.

SUMMARY OF THE INVENTION

The present invention electrically incorporates the information bearing medium to complement recent developments in the thin film cross-tie memory by providing a process and a single Permalloy layer circuit utilizing the magnetoresistance of the strip to nondestructively sense binary information stored in a selected location along the core of the domain wall of the strip. Voltages are applied to the margin of the strip, and the value of the voltage measured at an arranged contact centered on the core of the domain wall is determined by the flux pattern lying intermediate these contacts and is therefore indicative of the presence or absence of a Bloch-line — crosstie pair at that location.

Accordingly, it is an object of the present invention to provide a fast, non-volatile device for detecting binary information at a selected location on a thin magnetic film strip.

It is another object of the present invention to provide a thin film memory in which storage, propagation and detection of binary information occurs in a single layer medium.

It is yet another object of the present invention to provide a thin film memory employing an integrated detector circuit for distinguishing between selected magnetic field patterns on the surface of the film.

BRIEF DESCRIPTION OF THE DRAWINGS

A more complete appreciation of this invention and the many attendant advantages thereof will be readily acquired as the same becomes better understood by reference to the following detailed description when considered in conjunction with the accompanying drawings in which like numbers indicate the same or similar components, wherein.

DETAILED DESCRIPTION OF THE EMBODIMENTS

A domain wall is a boundary between domains in which magnetization occurs in different directions. In ferromagnetic materials, the neighboring magnetic-moment vectors are tightly coupled to form a large net macroscopic magnetization vector M, which in many situations can be considered uniform over the sample. The direction of net magnetization vector M is controlled by the induced anisotropy. In a sample of ferromagnetic material of finite dimensions (e.g., a film strip of a uniform 320Å thickness and having a width sufficient to accomodate the length of a crossite - 10 to 30 microns) the influence of the edges of the sample upon the alignment of the magnetic-moment vectors overwhelms the induced anisotropy causing the vectors to gradually seek alignment in opposite directions across the width of the sample after application of a magnetic pulse parallel to the width of the sample of sufficient magnitude to produce a nearly equal orientation of the vectors, thereby creating two domains. Each domain has an oppositely directed net magnetization vector. That width of the sample required for the orientation of the individual magnetion to differ by 180° is referred to as a "domain wall" and marks the separation between the adjacent, but differently directed domains. At the center or core of the domain wall the individual vectors are oriented in either direction parallel to the width of the sample.

Domain walls have widths ranging from about 200 Å to 20,000 Å, depending upon the type, material and its. There are three types of domain walls occurring in thin permalloy films: the Bloch wall that predominates in bulk materials of greater than 1,000 Å of thickness, the unipolar Neel wall found in very thin films of approximately 100 Å thickness, and the crosstie wall. The crosstie wall is stable in magnetic materials of intermediate thickness, and has oppositely oriented sections of Neel walls bounded on one side by a Bloch line and on the other side by a crosstie. As Bloch lines and crossties can be predictably nucleated and propelled by application of magnetic fields of measurable amplitude, duration, and direction, the domain wall of a thin magnetic film is particularly adaptable for use as a serially accessible memory such as a shift register.

In copending application, U.S. patent application Ser. No. 720,296, there is disclosed a novel thin magnetic film strip on which Bloch line - crosstie pairs are stored and propagated along the domain wall of an array of thin magnetic films. The crosstie memory taught there is suitable for use as a disk or drum memory replacement, or a block oriented random access memory, or as a silicon integrated component of a microprocessor. The basic building block essential to each of these devices is the thin magnetic film strips serving as shift registers. The crosstie memory stores information in the domain walls of the film strip shift registers rather than in the magnetic domains, and utilizes amenability of Bloch lines to nucleation and propagation in response to application of distinctive magnetic fields to represent that information.

Figure 1:
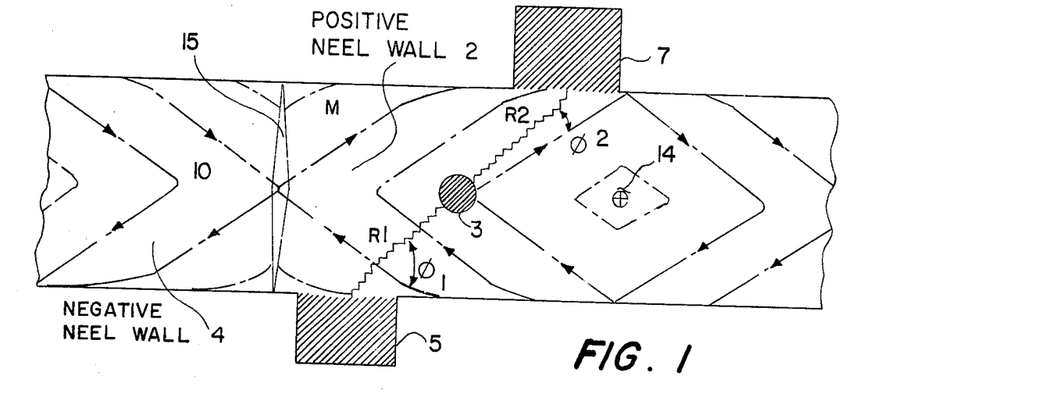
FIG. 1 of the drawings is a qualitative top view of a section of thin magnetic film.

Referring now to the drawings, and in particular to FIG. 1 where a top view presents a qualitative description of a section of a thin magnetic film strip 10. A section of positive Neel wall 2 is bounded on one side by a Bloch line 14. A crosstie 15 forms a common boundary between positive Neel wall 2 and a section of negative Neel wall 4. The arrowheads of the dashed lines distributed across film strip 10 give an exaggerated indication of the orientation and alignment of the individual magnetization vectors. As shown, there is a net magnetization to the right in the upper domain of strip 10 and a net magnetization to the left in the lower domain. Tabular protrusions 5, 7 and the circular crosshatched area 3 are undistinguishable, integral parts of, and thus complanar with the surface of film strip 10. A voltage source connected across contact regions 5, 7 causes an electrical current through film strip 10 that follows the path indicated by resistances $R_1$, $R_2$. The location of contact region 3 is arranged to coincide with the core of the domain wall of film strip 10 and the approximate center of the current path $R_1$, $R_2$. The current path in the lower domain, indicated by resistance $R_1$, forms an angle $\phi_1$ with the orientation of the magnetization vectors in that domain while the current path in the upper domain, indicated by resistance $R_2$, forms an angle $\phi_2$ with the upper domain magnetization. The resistance encountered by the current flowing between contact regions 5, 7 is due to the magnetoresistance effect. The value of the resistances $R_1$, $R_2$ are dependent upon the angle $\phi_1$, $\phi_2$ respectively, formed by the current's path with respect to the direction of local magnetization transversed.

The crosshatched areas 3, 5, 7 are integral parts of the thin-film strip 10, and serve as electrical contact regions. If an external voltage source is used to hold contacts 5, 7 at minus 0.2 volts and plus 0.2 volts respectively, a current will flow between contacts 5, 7 along the path indicated by resistances $R_1$, $R_2$. The directions of the dash lines distributed across film strip 10 to represent the alignment of the magnetization vectors have been exaggerated in order to clarify this description. It may be seen that between signal contact 3 and the +0.2 volt contact 7 the direction of magnetization is almost parallel to the current path indicated by resistance $R_2$, and that between signal contact 3 and the 0.2 volt contact 5 the direction of magnetization is almost perpendicular to the current path indicated by resistance $R_1$. Due to the magnetoresistance effect, the resistance encountered by current in a permalloy material flowing parallel to the direction of magnetization is 2 to 3% greater than the resistance encountered by the current when flowing perpendicular to the direction of magnetization. Thus, the upper resistance arm $R_2$ (i.e., the resistance in the upper domain) has a greater value than the lower resistance arm $R_1$ (i.e., the resistance in the lower domain). Accordingly, the voltage measured at contact 3 will have a negative valve. If a binary data bit as represented by the Bloch line 14 crosstie 15 pair was not present in the particular memory cell shown by the section of film strip 10 illustrated in FIG. 1, a negative Neel wall rather than the positive Neel wall 2 shown would be present between detector contacts 5, 7, and, the voltage measured at contact 3 will have a positive value. The difference in the value of voltages measured at sensor contact 3 caused by the change in polarity of the resident Neel wall is large to reliably detect the presence or absence of binary information in that memory cell.

The measured resistance R between two regions 3-5 or 3-7 on the surface of a thin magnetic film strip 10 due to the magnetoresistance effect of permalloy is given by the equation:

$$R = R_o + \frac{\Delta R \cos 2\phi}{2} \text{ where, } R_o = \frac{R_p + R_n}{2} ; \quad (1)$$

$\Delta R = R_p - R_n$;

$\phi$ = the smaller angle between the path of the applied current and the orientation of the local magnetization $R_p$ = that resistance measured when the path of the applied current is parallel to the direction of the local magnetization; and, $R_n$ = that resistance measured when the path of the applied current is coplanar with but normal to the direction of the local magnetization.

Accordingly, $$R = \frac{R_p + R_n + (R_p - R_n) \cos 2\phi}{2} \quad (2)$$

In permalloy films of approximately 350 Å, $R_p$ is 2 to 3% greater than $R_n$.

Therefore, for:

$$R_p = 1.02 R_n \quad (3),$$

$$R = R_p [0.99 + 0.01 \cos 2\phi] \quad (4).$$

The variation of the measured resistance with the angle between the path of the current and the direction of the local magnetization $\phi$, is shown in the following table.

Table I

| $\phi$, Degrees | R, OHMS |
|---|---|
| 0 | $R_p$ |
| 15 | $0.995 R_p$ |
| 45 | $0.990 R_p$ |
| 90 | $0.980 R_p$ |

By taking the first derivative of equation (2) and solving it for $d^2R/d\phi^2 = 0$, it may be shown that the rate of change of the measured resistance with respect to $\phi$ is a maximum when $\phi = 45°$. A sensitive voltage sensor should therefore be placed at contact region 3, with the location of region 3 arranged with respect to electrical contacts 5, 7 so that the path of the current flow between contacts 5, 7 forms an angle $\phi=45°$ with the direction of net magnetization in each domain. If the net magnetization in each domain has a direction substantially parallel to the oblong dimension of the film strip 10, then electrical contact regions, 5, 3, 7 should be arranged to form an angle of 45 degrees with respect to the edges of strip 10.

As noted above, the directions of magnetization indicated by the arrowheads of the dashed lines distributed across film strip 10 of FIG. 1 are exaggerated to simplify the foregoing description. The actual directions of the magnetization vectors found in transversing the domain wall are approximated by the equation:

$$\theta = 0.4 [1-(y/15\mu m)] \tag{5}$$

where, $1\mu m \leq y \leq 15\mu m$;
the domain wall is 30$\mu$m wide; voltage sensor contact 3 is 2$\mu$m in diameter and is centered on the core of the domain wall;
$y$ is the perpendicular distance measured from the center of the core to the point of interest; and,
$\theta$ is the angle between the magnetization vector M and the easy axis of film strip 10.

The measured resistance in the upper domain of film strip 10 may be averaged according to the equation;

$$R = R_o + \frac{\Delta R}{2} \int_1^{15} \cos 2\phi \frac{dy}{l} \tag{6}$$

where, $l$ is a length from the center of the core to one edge of the domain wall such that $1\mu m \leq l \leq 15\mu m$.

If the electrical contacts 5, 3, 7 are arranged at an angle of 45° with the oblong dimension of film strip 10, then $\phi=(45° - \theta)$, so that $\cos 2(45° - \theta) = \sin 2\theta$, and $$R = R_o + \frac{\Delta R}{2l} \int_1^{15} \text{SINE } 0.8 \left(1 - \frac{y}{15}\right) dy, \text{ or} \tag{7}$$

$$R = R_o + (\Delta R/5.6) \tag{8}$$

Accordingly, in the lower domain of strip 11, where the magnetization is nearly perpendicular to the path of the applied current, the measured resistance between contacts 5, 3 will be less than $R_o$ by an amount $\delta = \Delta R/5.6$, while in the upper domain where the magnetization is nearly parallel to the path of the applied current, the measured resistance will be greater than $R_o$ by an amount $\delta = \Delta R/5.6$. With a minus 0.2 volts applied to contact 5, a positive 0.2 volts applied to contact 7, and a current density of approximately $5 \times 10^6$ ampers per square centimeter, the current I between contact regions 5, 7 is determined by the equation:

$$I = \frac{0.4 \text{ volts}}{R_1 + R_2} = \frac{0.4 \text{ volts}}{2R_o} . \tag{9}$$

The voltage $V_s$ measured at signal contact 3 is then:

$$V_s = 0.2 - I [R_o + (\Delta R/5.6)] \tag{10}$$

If $\Delta R = 0.02 R_o$, then:

$$V_s = 0.714 \text{ mV} \tag{11}$$

As some current spreading occurs, this value should be reduced to approximately −0.5 millvolts. Similarly, the presence of a negative Neel wall between detector contacts 5, 7 will produce a +0.5 millivolt measurement at sensor contact 3. The approximately 1 millivolt difference between the measured sensor voltages is adequate in view of the state of present circuit design to detect the presence or absence of a Bloch line-crosstie pair within the particular memory cell to which the detector circuit is directed. The resistance between outer detector contacts 5, 7 is normally about 20 ohms. The current density may be as high as $10^7$ amperes per square centimeter. With a signal bandwidth in the detector of 150 MHz., the Johnson noise level of the detector is a few microvolts. Approximately a 40 decibel signal to noise ratio can be expected.

Figure 2A:
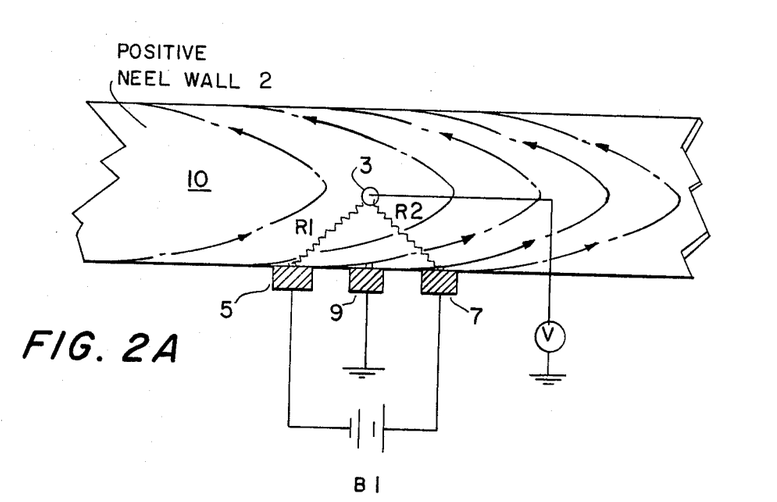
FIG. 2A of the drawings is a qualitative top view of a section of thin magnetic film containing a positive Neel wall.
Figure 2B:
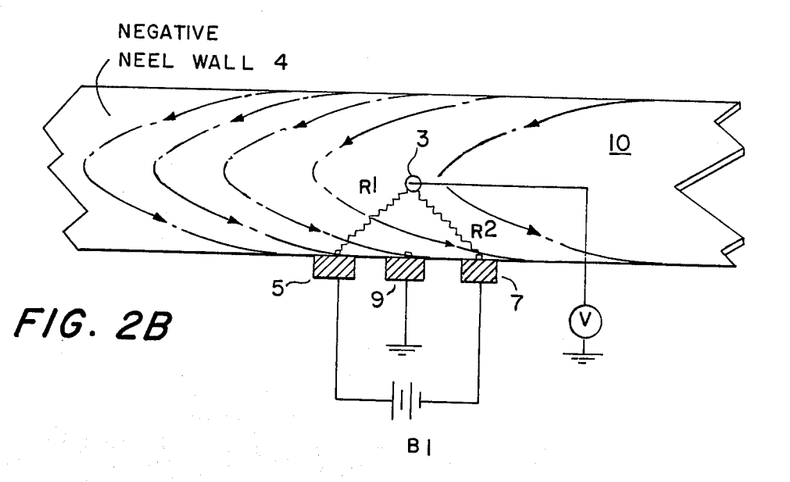
FIG. 2B of the drawings is a qualitative top view of a section of thin magnetic film containing a negative Neel wall.

The detector circuit set forth in FIG. 1 has voltage contact regions 5, 7 arranged on opposite edges of strip 10. Referring now to FIG. 2A, there is shown a top view of a section of thin magnetic film strip 10 with integral electrical connector regions 5, 7, 9 coplanar with the surface of strip 10 and arranged along the same edge. The dashed lines distributed across strip 10 represent the magnetization concominant to the presence of a positive Neel wall 2. In operation, a negative voltage $B_1$ is applied to contact 5 while a positive voltage is applied to contact 7. Voltage sensor contact pad 3 is positioned at the center of film strip 10 over the core of the domain wall and is arranged so that current flowing between contacts 7-3 and 3-5 form angles of 45° with the direction of net magnetization in the domain bounded by the edge along which contacts 5, 7 are arranged. The voltage at contact 3 may be measured through an external capacitor (not shown) if the use of external resistors to form a Wheatstone bridge is not desired. With a positive Neel wall 2 present in the section of strip 10 shown, a negative voltage will be measured at sensor contact 3. If a negative Neel wall 4 is present however, as is shown by FIG. 2B, a positive voltage will be measured at sensor contact 3.

A more sensitive detector circuit is available by using grounded contact 9 to form a Wheatstone bridge thereby dispensing with the necessity of measuring the voltage at sensor pad 3 through an external capacitor. The resistance encountered by current flowing between contacts 7-9 and 9-5 is substantially independent of the polarity of the resident Neel wall as the direction of current flow between these contacts is along the outer margin of strip 10 and is nearly parallel to the direction for magnetization there of both a positive and a negative Neel wall. Voltage measurements are made across contacts 3 and 9.

Figure 3A:
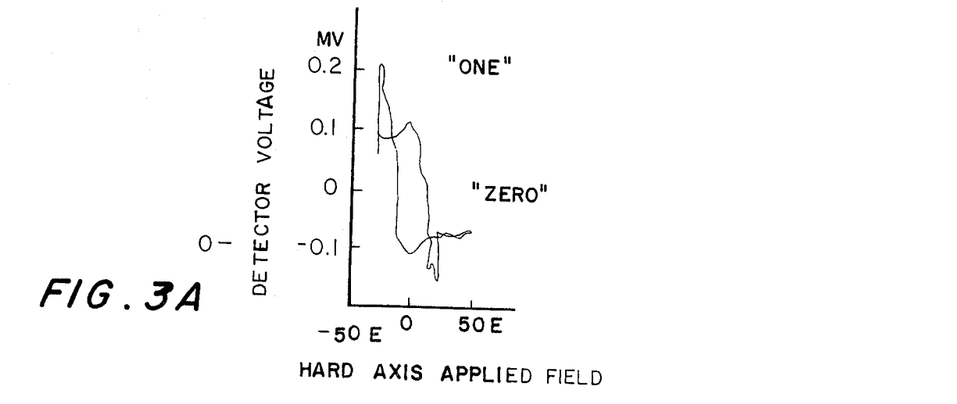
FIG. 3A of the drawings is a graphical display showing the cycle traced by a plot of detector voltage against magnitude of a magnetic field applied along the hard axis of a thin-film strip.
Figure 3B:
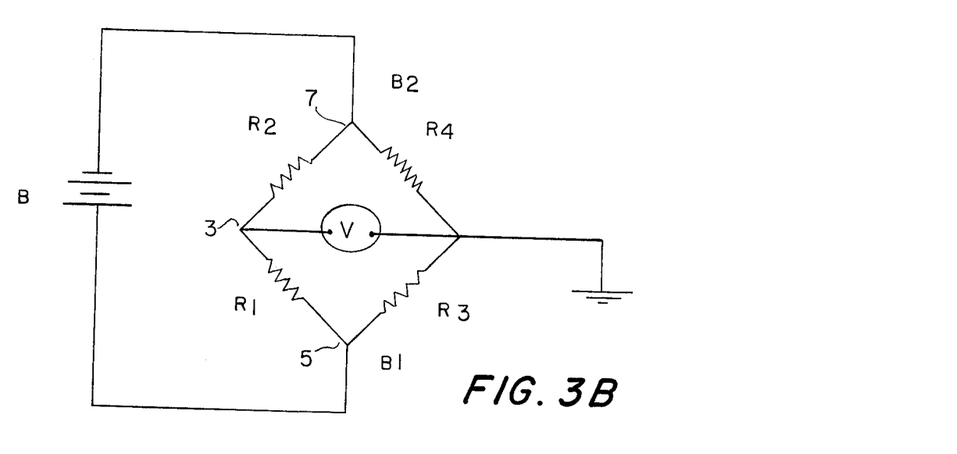
FIG. 3B of the drawings is the schematic showing the circuit used in obtaining the cycle plotted in FIG. 3A.

Referring now to FIG. 3A there is graphical representation showing along its abscissa the variation in amplitude of a magnetic field applied normal to but coplanar with the oblong dimension of film strip 10, and along its ordinate the responding variation in detector voltage. The resistance across contacts 5, 7 was approximately 14Ω. A 2.4 mA current was used, corresponding to a current density of $5 \times 10^5$ amperes per centimeter, or about one-tenth the density normally considered. Two external resistors were added to the detector circuit so that a Wheatstone bridge circuit as shown in FIG. 3B was formed. The curve displayed by FIG. 3A completes a cycle resembling a hysteresis curve. At zero applied field the two voltages shown, +0.11 mV and −0.11mV corresponding to a binary ONE and a binary ZERO respectively, are separated by 0.22mV. This measured separation is greater than predicted as the parallel magnetoresistance of the film strip 10 tested exceeded the perpendicular magnetoresistance by more than 2.3%. Additionally, in the film strip 10 tested contacts 5, 7 were along the same edge thereby permitting the current path to more closely approach the parallel and perpendicular angles desired to be formed with the magnetization in order to obtain the largest difference in amplitude in the voltage measured at sensor contact 3.

Figure 4A:
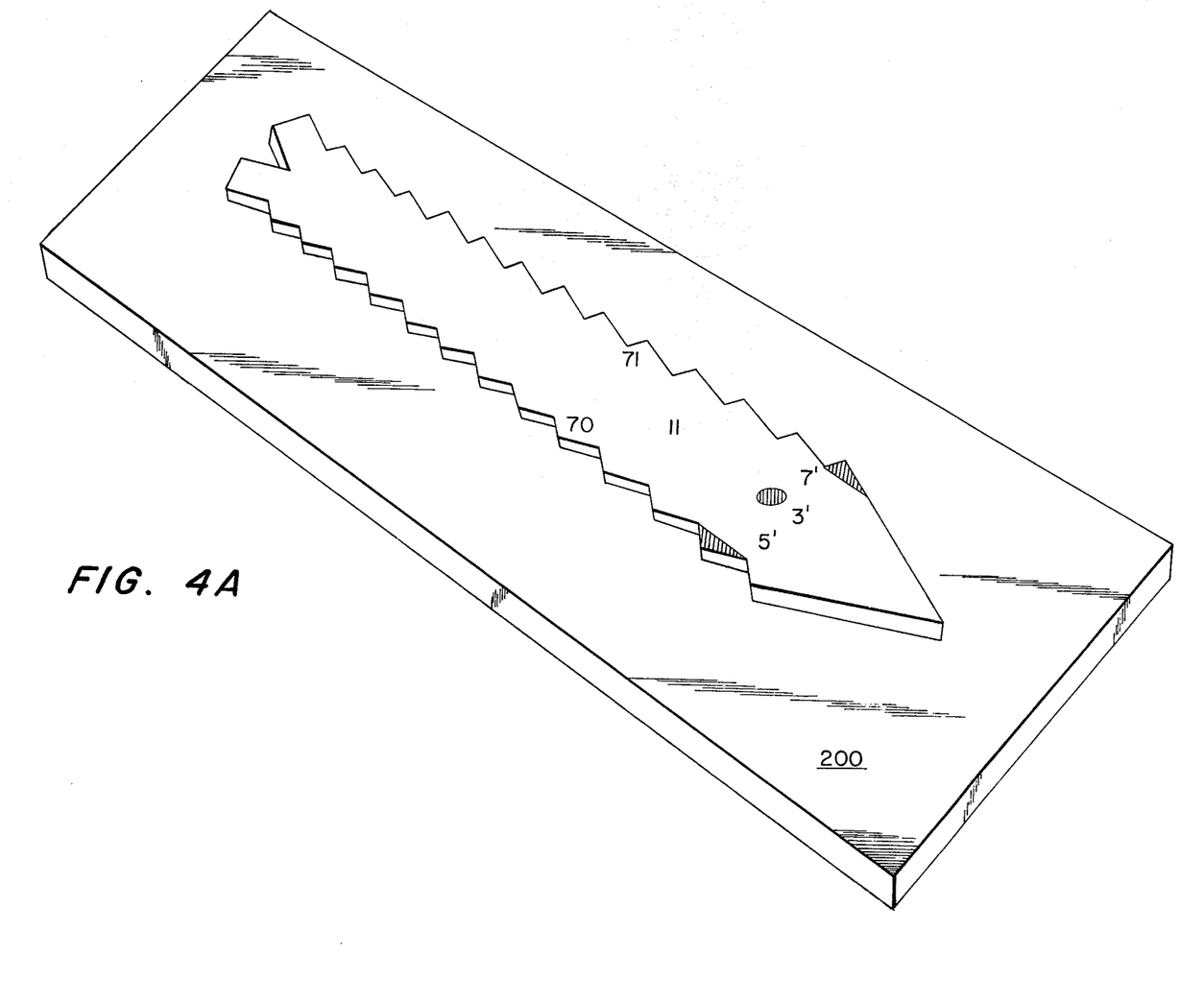
FIG. 4A of the drawings is a serriform thin-film strip.
Figure 4B:
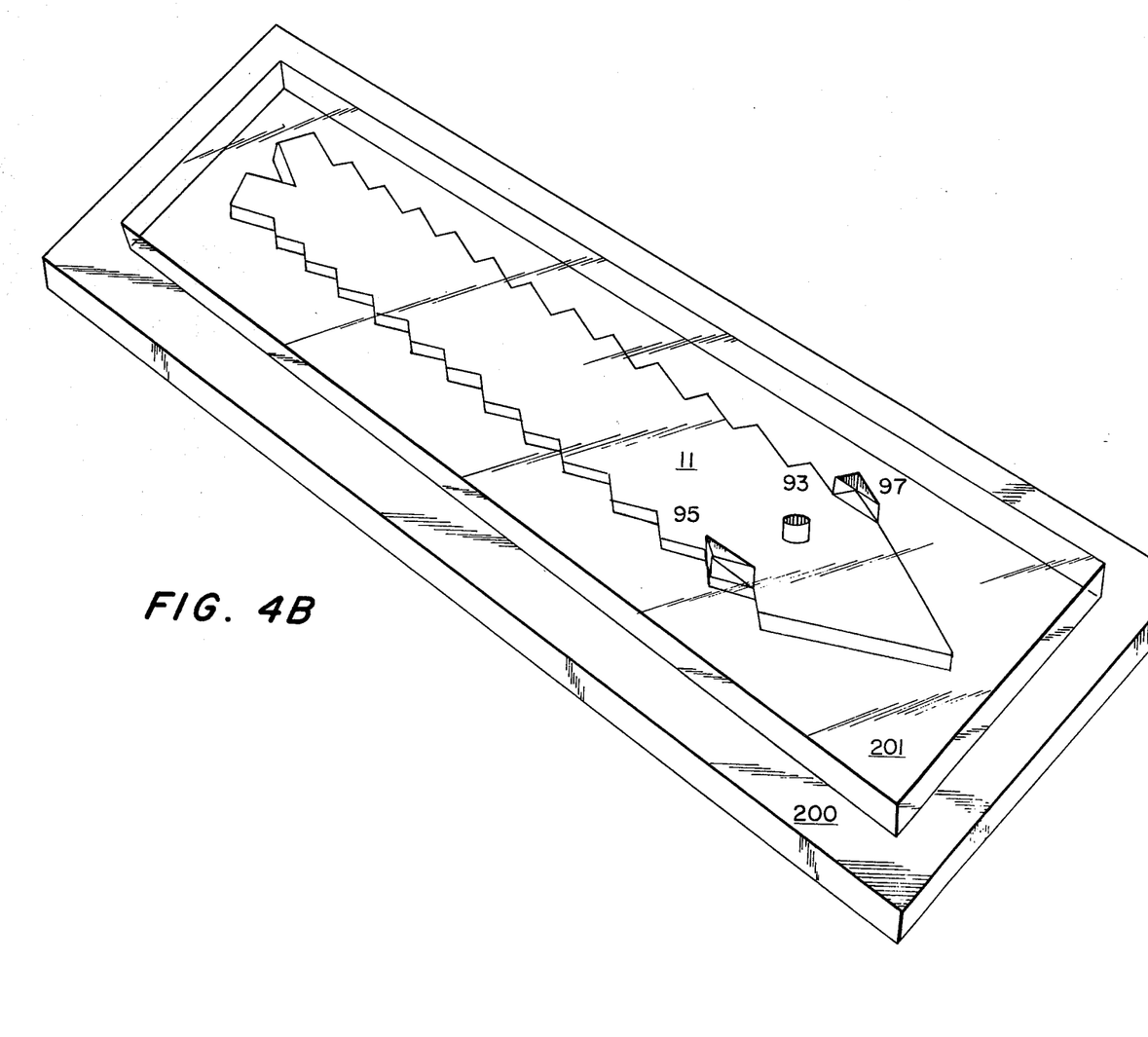
FIG. 4B of the drawings is a serriform thin-film strip over which a silicon layer of insulation has been placed.
Figure 4C:
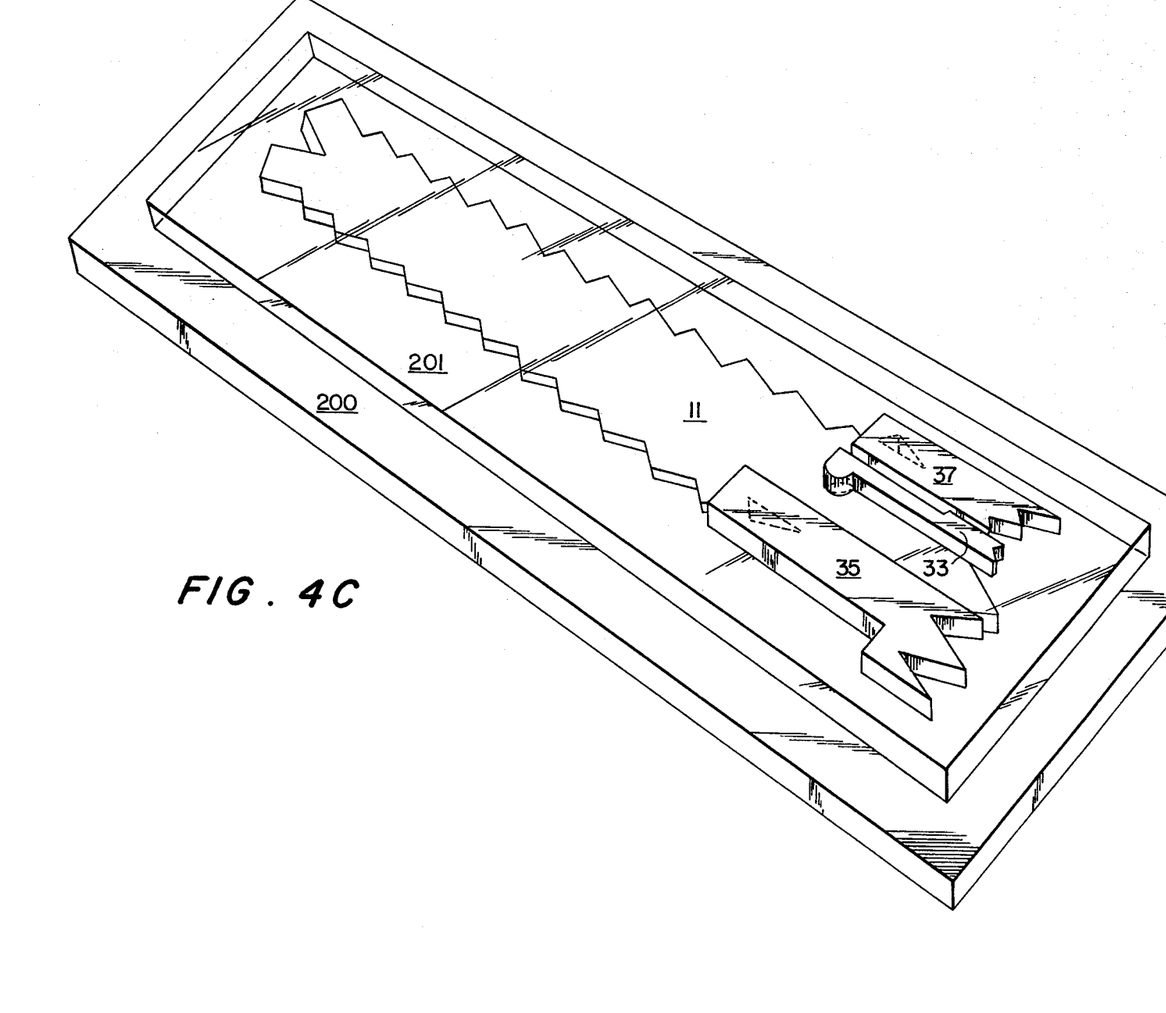
FIG. 4C of the drawings is the serriform thin-film strip of FIG. 4B showing the external leads to the detector circuit.

Referring now to FIG. 4A there is shown a serriform thin magnetic film strip 11 according to the teachings of copending U.S. application Ser. No. 720,296. In a serriform strip each denticle along the margins of the strip or, if the margins are symmetric about the oblong dimension of the strip, each pair or, every other pair or every third pair, depending upon the number of steps in the particular propagation scheme desired) of opposite denticles 70, 71 defines a memory cell. Either a set of spaced oblique tabulations protruding from but coplanar with the surface of the margins of the strip, or a pair of oblique denticles may be used as electrical contact regions 5′, 7′ across which an external voltage source is connected in the manner shown by FIGS. 2A and 2B. An additional contact region 3′ is centered on the core of the domain wall of strip 11 and arranged obliquely with respect to the oblong margins of strip 11 and to contact regions 5′, 7′ so that the direction of current flow between region 7′ and 3′ is nearly either parallel or perpendicular to the direction of the underlying magnetization while the direction of current flowing between contact regions 3′ and 5′ is nearly either perpendicular or parallel respectively, to the direction of the underlying magnetization, depending upon whether the intermediate magnetization is a negative or a positive Neel wall respectively. Typically strip 11 is etched from a layer of permalloy of uniform thickness upon a SiO-SiO$_2$ substrate 200. An electrically insulating layer 201 (e.g., SiO$_2$) is placed over the etched permalloy strip 11 as shown by FIG. 4B. Via or ports 93, 95, 97 are etched through the insulating layer 201 in order to provide electrical access to contact pads 3′, 5′, 7′ respectively. A straightforward etching technique works well on the insulating layer 201 if the substrate 200 is SiO$_2$. If substrate 200 is glass, the etchant penetrates the Ni—Fe strip 11, attacks the glass substrate 200, and floats the Ni—Fe free. When a glass substrate is used, raised thick posts are photolithographically defined over those areas of strip 11 designated as contact pads 3, 5, 7. The dielectric insulating layer 201 is then deposited over strip 11, forming caps over the raised contact posts covering contact regions 3′, 5′,7′. The assembly is immersed in a reagent which attacks the post material, allowing the post material to float free or to be swabbed off. In one embodiment a 12,000 Å layer of SiO$_2$ was used as the dielectric layer 201; however, sputtered, SiO, a better passivating material, may also serve as a dielectric layer. Chrome, and then gold are next deposited upon the exposed surface of layer 201 and etched to form the conductors 33, 35, 37 shown in FIG. 4C, for coupling contact regions 3, 5, 7 respectively to the external components of the detector circuit. It is understood that dielectric layer 201 only serves to insulate electrodes 33, 35, 37 from strip 11. Electrodes 35, 37 may be coplanar with the surface of strip 11; however, the proximity of adjacent strips 11 in a crosstie memory array suggests the desirability of placing all electrodes on the exposed surface of dielectric 201.

Permalloy can be satisfactorily deposited on semiconductor grade silicon. To produce a film having zero magnetorestriction the iron content must be increased by 0.6% over the usual 82.8% Ni—17.2% Fe composition of the permalloy strip 11 deposited on a glass substrate. By fabricating the crosstie memory on silicon chips or wafers in an array as set forth in FIG. 8, the amplifiers for the detectors can be fabricated on the same chip. The advantages of this chip assembly are an increased bit density and a reduction in the required sensor contact 3 voltage difference to a fraction of 1 millivolt. In addition, the shift register drive as well as the memory decoding circuitry may be integrated upon the same chip to provide a convenient nonvolatile, semiconductor memory suitable for use as a stand-alone component.

Figure 5:
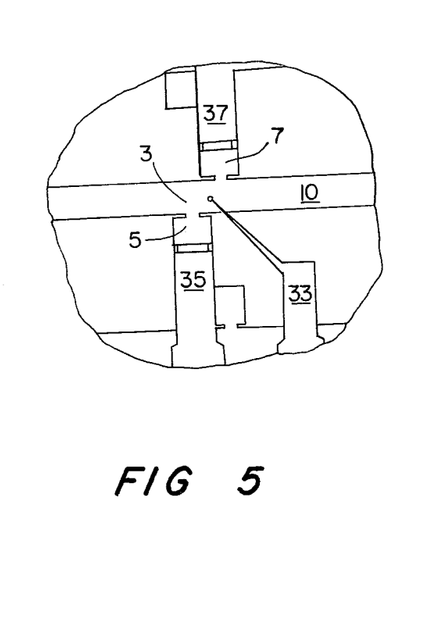
FIG. 5 of the drawings is an enlarged top view of a section of thin-film strip detector qualitatively shown in FIG. 1.
Figure 6:
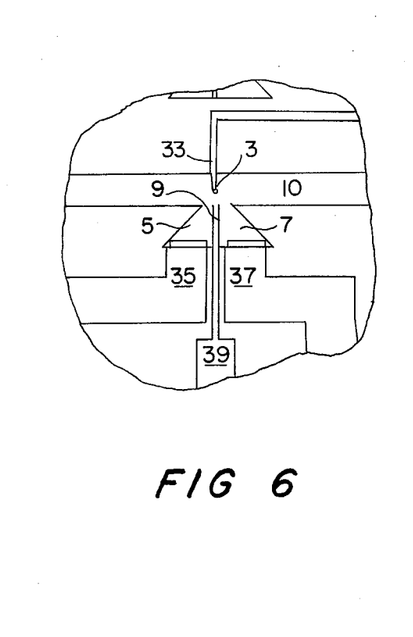
FIG. 6 of the drawings is an enlarged top view of a section of thin-film strip detector qualitatively shown in FIGS. 2A and 2B.

FIG. 5 sets forth in axonometric projection an illustration of the detector circuit shown in FIG. 1 of the drawings. Thin magnetic film strip 10 has parallel oblong margins with a centered contact region 3 located over the core of its domain wall (not shown). Contact regions 5, 7 are bounded by opposite margins and are arranged obliquely opposite contact region 3. A dielectric layer 201 serves an an electrical insulator between the surface of strip 10 and electrodes 33, 35, 37. Holes or ports through dielectric layer 201 expose contact regions 3, 5, 7 to allow their electrical coupling to electrodes 33, 35, 37 respectively. FIG. 6 also sets forth in axonometric projection an illustration of the detector shown in FIGS. 2A and 2B. Contact regions 5, 7, 9 are bounded by a common margin. Regions 5, 7 are arranged obliquely with respect to region 3 and their common margin in order to assure that a current traveling in each leg 7-3 and 3-5 of the detector circuit encounters the magnetization of the resident Neel wall at approximately complementary angles. A dielectric layer 201 serves as an electrical insulator between the surface of strip 10 opposite substrate 200. Ports through dielectric layer 201 expose contact regions 3, 5, 7, 9 to allow an electrical coupling with electrodes 33, 35, 37, 39 respectively.

Figure 7:
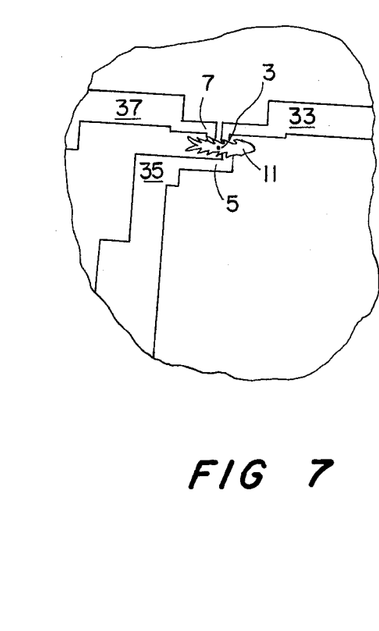
FIG. 7 of the drawings is an enlarged top view of a serriform thin-film strip detector.

FIG. 7 sets forth a third axononetric projection of a detection circuit according to the teachings of the present invention. Thin magnetic film strip 11 has serriform margins, each margin having a plurality of denticles. Two of these denticles, here obliquely opposite denticles bounded by opposite margins serve as contact regions 5, 7. Contact region 3 is centered upon the core of the domain wall (not shown). A dielectric layer 201 serves as an electrical insulator between the surface of strip 11 opposite substrate 200. Ports through dielectric layer 201 expose contact regions 3, 5, 7 to allow an electrical coupling with electrodes 33, 35, 37 respectively.

Figure 8:
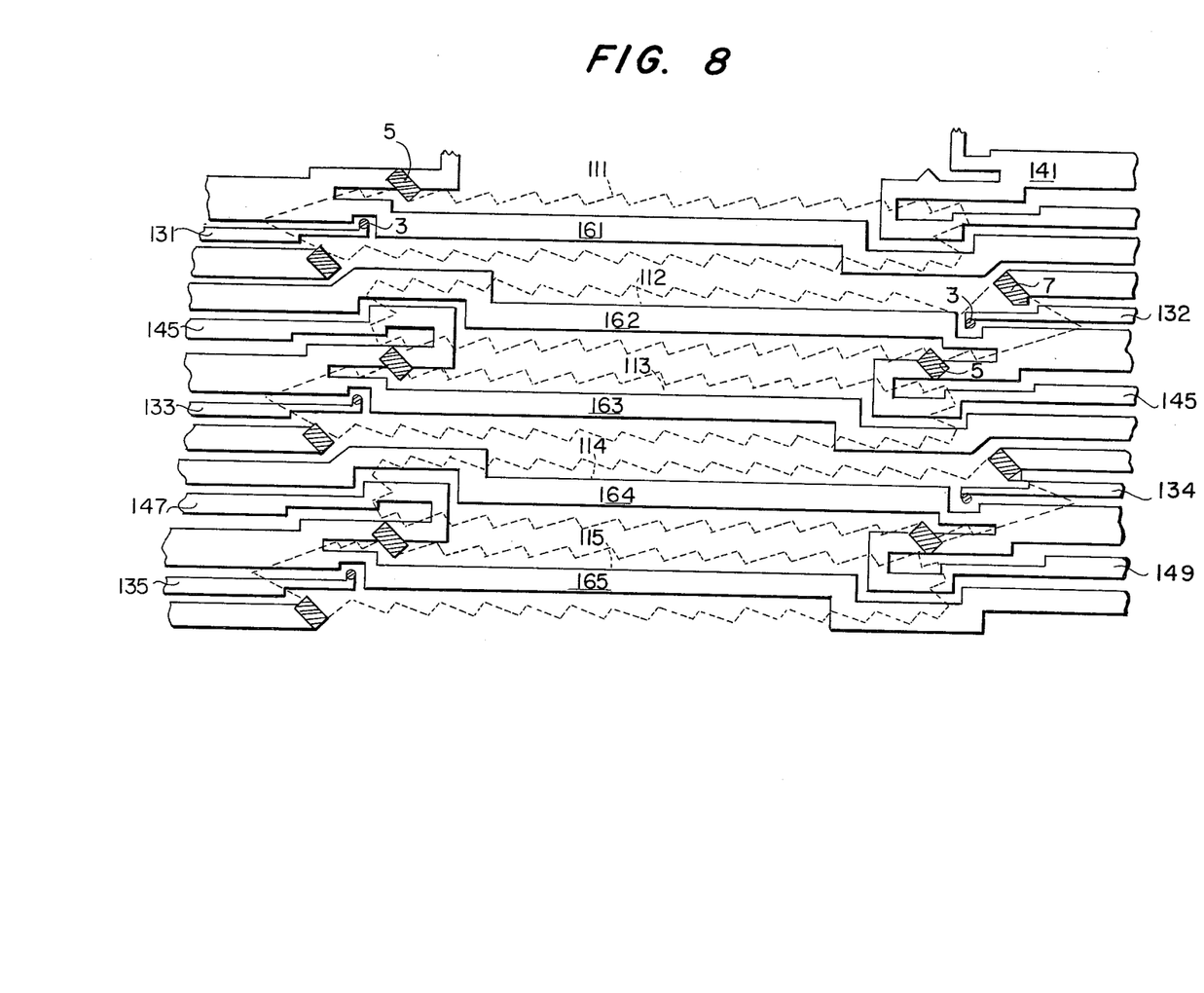
FIG. 8 of the drawings is an array of serriform thin-film strips showing the external drive and detector conductors.

Referring now to FIG. 8 where there is shown a top view of a segment of a stand-alone crosstie memory array susceptible to single conductor propagation of Bloch line-crosstie pairs. Five serriform thin film memory strips 111, 112, 113, 114, 115 are covered by a dielectric insulating layer 201. Drive or propagate electrical conductors 161, 162, 163, 164, 165 and nucleate electrical conductors 141, 143, 145, 147, 149 are placed on the exposed surface of layer 201 and spaced-apart in an arranged sequence with respect to the corresponding of the strips 111, 112, 113, 114, 115 respectively. The propagation conductors 161-165 are centered over the center-lines of the thin-film strips 111, 112, 113, 114, 115 respectively, running from the first set of memory cells following the memory cell adjoining the homocercal tail of the strip to the detector sense contact 3. After passing the detector sense contact 3, each propagation conductor (e.g. 162) of one strip 112 passes over the notch of the homocercal tail as a nucleate conductor (e.g., 145) of an adjacent strip 113. Prior to reaching the notch of the adjacent strip 163 however, the propagation conductor passes over and is electrically coupled to one terminal 5 of the detector circuit. An electrically isolated conductor 131-135 is electrically coupled to the detector circuit's voltage sensor contact 3 in each of the five strips 111-115 shown. The nucleation and propagation schemes are more fully described in copending U.S. application, Ser. No. 720,296 Navy Case No. 59,905.

The repulsive force exerted by a crosstie on a Bloch line is an important force in single conductor propagation. For reliable operation, the potential well for a Bloch line should be no more than approximately 4 microns distant from its corresponding cross-tie. Therefore, the length of the base of each denticle (i.e., the distance between successive indents) should be no more than approximately 8 microns. In order to minimize interference between adjacent bits, no more than one bit should be stored in any three adjoining memory cells, thereby making the period of a thin-film, serriform strip shift register approximately 24 microns in length. A pulse propagation scheme would have to be repeated three times to move each bit through a single, three cell period. With an estimated propagation rate of 48 nanoseconds per period, a serriform strip shift register will have a shift rate of approximately $20 \times 10^6$ bits per second. A shortened period length will allow an increased shift rate.

Accordingly, it is apparent in light of the foregoing teachings that the present invention provides in a thin-film shift register a circuit and a method for detecting the presence and absence of binary information represented by Bloch line-crosstie pairs in the particular memory cell to which the circuit is directed. By utilizing the slight difference between the magneto-resistance encountered by a current flowing parallel and a current flowing normal to the magnetization of a thin-film strip, embodiments of the present invention through a measurement of the voltage at the core of the strip, supply a signal indicative of the presence of absence of binary information in area transversed by the current.

Although the foregoing embodiments are described as having a plurality of tabular electrical connection pads 5, 7, 9 coplanar with the surface but often protruding away from the edges of the thin-film strip 10, it should be apparent from the foregoing teachings that connections pads 5, 7, 9 are merely those areas on the surface of the thin-film strip to which external electrical conductors are mated. It is possible to couple the external conductors to any area on the surface of the strip; however, in order to assure the greatest difference in sensor voltage, the areas on the surface of the strip to which the external conductors are mated should provide at least one current path with two distinct legs joined at contact pad 3 at the core of the domain wall whereby the direction of current flow in one leg is nearly parallel to the direction of the magnetization underlying parts of the strip transversed while the direction of current flow in the joining leg is nearly perpendicular to the direction of its underlying magnetization.

The foregoing embodiments are merely illustrative of the basic principles of the invention. Obviously, numerous modifications of the present invention are possible in light of the above teachings. For example although the thin-film strip shown in FIGS. 1, 2A and 2B had smooth margins with parallel edges, the presently disclosed detector circuit is adaptable to the straight serriform strip shown in FIGS. 4A, 4B and 4C as well as to circular, coiled or serpentine shaped thin magnetic film strip. A thin-film strip may have more than one detector circuits, even with adjacent memory cells having electrically distinct and simultaneously operating detector circuits.

What is claimed as new and desired to be secured by Letters Patent of the United States is:

1. A circuit for non-destructively detecting the presence and absence of binary information at a selected location along a shift register suitable for the storage and propagation of Bloch-line-crosstie pairs, comprising:

an insulating substrate layer;
a thin-film strip of a magnetic material of uniform thickness deposed upon a surface of said substrate and having a continuous, stationary domain wall spaced between its oblong margins;
a dielectric insulating layer covering all but a plurality of non-adjoining regions on that surface of said strip opposite said substrate layer, a first of the regions centered upon the core of the domain wall at said selected location and a second and a third of the regions each contiguous to one of said margins; and
a plurality of electrodes equal in number to the number of said regions and disposed in spaced relation to each other, each electrode mated with a corresponding said region;
whereby application of a potential difference across a second and a third of said electrodes causes a voltage at a first of said electrodes having an amplitude dependent upon the residence of a Bloch line - crosstie pair intermediate said selected location.

2. The circuit set forth in claim 1 further comprised of said second and said third region each bounding the same one of said margins and arranged each obliquely with respect to the bounding margin and said first region.

3. The circuit set forth in claim 1 further comprised of said second and third region each bounding a different one of said margins and each arranged obliquely with respect to its bounding margin and said first region.

4. A circuit for non-destructively detecting the polarity of an intermediate Neel wall in a selected location of a crosstie shift register, comprising:

a thin-film strip of a magnetic material of uniform thickness deposited upon an insulating substrate layer, the strip having a continuous, stationary domain wall spaced between its oblong margins and having on its exposed surface a plurality of non-adjoining regions arranged about said location including a first region centered upon the core of said domain wall, and a second and a third region each contiguous to one of said margins; and
a plurality of electrodes equal in number to the number of said electrodes and disposed in spaced relation to each other, each electrode electrically coupled to a different corresponding said region;
whereby application of a potential difference across a second and a third of said electrodes causes a voltage at a first of said electrodes having an amplitude dependent upon the polarity of any Neel wall intermediate said second and third regions.

5. The circuit set forth in claim 4 wherein said regions comprise non-adjoining areas coplanar with and indistinguishable from the remainder of the surface of said strip opposite said substrate.

6. The circuit set forth in claim 5 wherein said second and said third electrode is coplanar with the surface of the region to which it is coupled.

7. The circuit set forth in claim 5 wherein said strip is further comprised of said second and third regions bounded by opposite said margins and said second region arranged obliquely across said first region from said third region.

8. The circuit set forth in claim 5 wherein said strip is further comprised of said second and third regions bounded by a common margin and each arranged obliquely with respect to said first region.

9. The circuit set forth in claim 8 wherein said strip is further comprised of a fourth region spaced-apart between said second and third regions and bounded by said common margin whereby application of a potential difference across a second and a third of said electrodes causes voltage across a first and a fourth of said electrodes having an amplitude dependent upon the polarity of any Neel wall intermediate said second and third region.

10. A circuit for non-destructively detecting the polarity of an intermediate Neel wall in a selected location of a crosstie shift register, comprising:
an insulating substrate layer;
a thin-film strip of a magnetic material of uniform thickness deposed upon a surface of said substrate, having a continuous, stationary domain wall spaced between its oblong margins, and having on its exposed surface a plurality of non-adjoining regions arranged about said selected location including a first region centered upon the core of said domain wall at said selected location, and a second region contiguous to one of said margins and a third region contiguous to one of said margins;
a dielectric layer covering the surface of said strip opposite said substrate; and
a plurality of electrodes equal in number to the number of said regions and disposed in spaced relation to each other, each electrode mated with a corresponding said region;
whereby application of a potential difference across a second and third of said electrodes causes a current that in transversing said strip between said second and said first region encounters a first resistance $R_1$ and that in transversing said strip between said first and said third region encounters a second resistance $R_2$ wherein the relative magnitudes of $R_1$ and $R_2$ are dependent upon the polarity of any Neel wall intermediate said second and third regions.

11. The circuit set forth in claim 10, further comprised of:
the second and the third region disposed obliquely about the first region contiguous to different of the margins.

12. The circuit set forth in claim 10, further comprised of:
the second and the third region disposed obliquely about the first region.

13. A serially accessible crosstie memory element, comprising:
a ferromagnetic layer of uniform thickness having regular, symmetrically disposed serriform margins;
a first electrical potential coupled to a first point adjacent to one of the margins;
a second electrical potential coupled to a second point adjacent to one of the margins; and,
a voltage sensitive means coupled across a ground potential and a location disposed about the first and second points and centered between the margins.

14. The element set forth in claim 13, further comprised of: the first and second points being separated by the location.

15. The element set forth in claim 13, further comprised of: the location being disposed between the first and the second points.

16. The element set forth in claim 15, further comprised of: the first and the second points being contiguous to different of the margins.

17. The element set forth in claim 15, further comprised of: the first and the second points being contiguous to the same of the margins.

18. The element set forth in claim 17, further comprised of: a third point situate between the first and the second point coupled to the ground potential.

19. The element set forth in claim 18, further comprised of: the third point being contiguous to the same of the margins.

20. A non-volatile detection circuit for sensing the presence of Block-line-crosstie pairs, comprised of:
a ferromagnetic oblong layer of uniform thickness having margins parallel to and symmetric about an oblong centerline;
a first electrical potential coupled to a first point adjacent to one of the margins;
a second electrical potential coupled to a second point adjacent to one of the margins; and,
voltage sensitive means coupled across a ground potential and a location on the centerline central to the first and second points.

21. The circuit set forth in claim 20, further comprised of:
the first and the second points being adjacent to opposite margins.

22. The circuit set forth in claim 20, further comprised of:
the first and the second points being obliquely aligned across the location adjacent to opposite margins.

23. The circuit set forth in claim 20, further comprised of:
the first and the second points being adjacent to the same of the margins.

24. The circuit set forth in claim 23, further comprised of:
a third point situate between the first and the second points and contiguous to the same of the margins, coupled to the ground potential.

25. The circuit set forth in claim 20, further comprised of:
each of the margins being formed by a plurality of uniformily oriented denticles arranged in a spaced relation to those denticles bordering the opposite edge, each denticle described by a first chord of length A having a projecting end meeting one end of a second chord of length B and a recessed end potentially intersecting a third chord at the centerline of the strip with an angle $\theta$, the unmet end of the second chord potentially intersecting the third chord at the centerline of the strip with an angle $\phi$, wherein:

$$A\cdot\text{SINE } 2\theta > B\cdot\text{SINE } 2\phi.$$

26. The circuit set forth in claim 25, further comprised of:
the first point being on a denticle; and,
the second point being on a denticle separated by the location from the first point.

27. The circuit set forth in claim 20 further comprised of the first electrical potential being equal in amplitude but opposite in polarity to the second electrical potential.

28. A crosstie memory element, comprised of:
an oblong ferromagnetic layer of uniform thickness bounded by a pair of denticulated margins parallel to and symmetric about an oblongly centerline of the layer, each margin formed by a plurality of opposite, equally spaced denticles, each denticle having a major edge intersecting a minor edge wherein for each denticle the projected length of its major edge upon the centerline exceeds the projected length of its minor edge upon the same centerline;
a first electrical potential coupled to a first of the denticles;
a second electrical potential coupled to a second of the denticles; and,
voltage sensitive means coupled across a ground potential and a location on the centerline central to the first and second denticles.

29. The element set forth in claim 28, further comprised of:
the first and the second of the denticles contiguous to the same margin.

30. The element set forth in claim 29, further comprised of:
the ground potential coupled to a point between the first and the second of the denticles.

31. The element set forth in claim 28, further comprised of:
the first and the second of the denticles contiguous to opposite margins.

32. The element set forth in claim 28, further comprised of:
the first and the second of the denticles obliquely aligned with the location.

* * * * *